United States Patent Office 2,859,111
Patented Nov. 4, 1958

2,859,111

LITHOGRAPHIC PRINTING PLATES INCLUDING SULFONIUM PERCHLORATES

Georg Werner, Wiesbaden-Biebrich, Germany, assignor, by mesne assignments, to Azoplate Corporation, Summit, N. J., a corporation of New Jersey No Drawing. Application March 10, 1955
Serial No. 493,557

Claims priority, application Germany March 12, 1954

18 Claims. (Cl. 96—33)

This invention relates to lithographic printing plates and light sensitive coatings therefor. More particularly, the invention is concerned with pre-sensitized printing foils and with the sensitizers used thereon.

For a long time photo-mechanical printing plates have been produced by coating a suitable support, e. g. a metal plate or foil, paper foils, acetate foils, etc., with a colloidal substance containing a light-sensitive substance. The printing plate is produced in this process by exposing the light-sensitive layer under an original, containing the image to be reproduced, the resultant image is then finished by development of the layer. It is possible to produce both positive and negative printing plates from a positive original by this method. More recently the practice has been to produce the light-sensitive layers without using a colloidal substance by coating the foil with a solution of the light-sensitive substance. The transfer of the image and the preparation of the printing plate after exposure are essentially similar using this material as compared with the procedure used when a material with a colloid layer is employed.

An object of the invention is the provision of a novel light sensitive material usable for the production of lithographic printing plates. A further object is the production of presensitized printing foils which are capable of being stored for long periods of time prior to being used while still retaining their light sensitivity. Other objects and advantages will be readily apparent from a reading of the description hereinafter following.

It has now been found that printing plates are advantageously obtained photo-mechanically by using, as the light-sensitive layer on aluminum bases, S-alkyl-thiodiaryl-amine sulphonium perchlorates of the general formula:

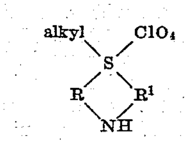

wherein R and $R^1$ stand for an arylene of the group consisting of arylenes of the benzene and the naphthalene series.

By "arylene" I intend to include within the scope thereof both substituted as well as unsubstituted arylenes. Dilute alkaline or acid solutions are used as developing agents for the exposed layer.

To produce the printing plates, the sulphonium perchlorates in question are dissolved in a suitable solvent, as for example ethylene glycol monomethyl ether, and the aluminum plates are coated with the solution under subdued light. After drying, these metal plates form a material very well suited for planographic printing. The new material shows good light-sensitivity and very good shelf-life. The compounds which are claimed give positive images from positive originals and negative images from negative originals upon removing the light-struck areas of the layer by the developing agents. Those areas of the coating remaining on the plate after development are hereinafter referred to as "imaged areas" and serve to accept greasy ink for reproducing copies of the original. Those areas which are removed by the developer are referred to as the "non-imaged areas." The use of a colloid is thus dispensed with.

The sulphonium perchlorates and their light-decomposition products which are used as light-sensitive substances react differently to the developers. The use of a dilute alkaline solution is suitable or sometimes essential for the development of some of these perchlorates, while for others a dilute acid solution is required. The expert can easily determine by a simple empirical test which type of developer is to be used. Examples of suitable alkaline developers are dilute aqueous solutions of acetates or of secondary or tertiary phosphates of the alkali metals, particularly sodium, while suitable acid developers include for example dilute acetic, phosphoric or sulphuric acids with the addition of a buffer salt, if desired, e. g. alum. Only low concentrations of the developer are generally required, e. g. 5–10% solutions.

I did not expect that the S-alkyl-thiodiaryl-amine sulphonium perchlorates would, after exposure under an original, result in decomposition products which with respect to the undecomposed compound differentiated between water and greasy ink (which is the basis of the offset process). Furthermore, I have found that only by using an aluminum base will plates be obtained which can give long runs.

The shelf-life of the thus coated aluminum plates is also particularly outstanding. Even after storing for more than one month under extreme conditions, e. g. in a tropical or sweat chamber, the light-sensitized plates are still completely usable for planographic printing. Such a result also could not be anticipated.

Many other sulphoninum perchlorates, which are suitable for the purposes of the present invention, can be produced in analogous manner to that described hereinafter. Thus, diethyl sulphate or dibutyl sulphate may be used instead of dimethyl sulphate for the alkylation of the thiodiaryl amines. Also, if 3-methoxy-diphenylamine is condensed with sulphur instead of diphenylamine, then thio-diphenylamines are produced, substituted by methoxy groups, which are equally suitable for alkylation by the action of dialkyl sulphate and subsequent reaction with perchloric acid to form the corresponding sulphonium perchlorates. S-methyl-2-methoxy-thiodiphenylamine sulphonium perchlorate, for example, has provided very suitable for the purposes of the present invention.

The following examples are given to further illustrate the light sensitive material of the invention and are not intended as being limitative of the scope thereof.

*Examples*

(1) A 0.5% solution is prepared of S-methyl-thiodiphenylamine sulphonium perchlorate of the formula

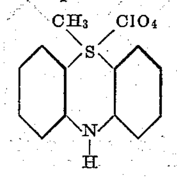

in the ethylene glycol monomethyl ether. The solution is applied to an aluminum plate previously roughened with a wire brush and the layer so formed is dried at 100° C. The light-sensitive layer is exposed under a positive original, for example, with an 18 ampere arc lamp at a distance of 70 cm. The exposed layer is then treated first with 5% sodium acetate solution and then with 5% gum arabic solution. After a run of 5000 positive reproductions of the original, the aluminum printing plate is still unchanged and capable of producing still further copies. The outstanding quality of the layer is evidenced by the fact that unexposed aluminum plates prepared in this way, after 31 days of storage in a tropical chamber will still produce good prints.

The S-methyl-thiodiphenylamine sulphonium perchlorate may be prepared as follows: 9.5 grams of thiodiphenylamine and 7 grams of freshly purified dimethyl sulphate are heated in a closed cylinder in a water bath at 80° C. for one hour. The contents of the cylinder which have then become fully liquefied are poured into half a liter of water and strongly agitated, whereupon the reaction product goes into solution, separating out some resinous substance consisting mainly of unattacked thiodiphenylamine. The solution is treated for a short time with some animal charcoal, then filtered, and the filtrate is mixed with a few cubic centimeters of 25% perchloric acid. Thus, a white, heavy crystalline powder is obtained, which is only slightly soluble in cold water and considerably soluble in boiling water.

(2) An aluminum plate is coated with a 1% solution of S-methyl thiophenyl-alpha-naphthylamine sulphonium perchlorate of the formula

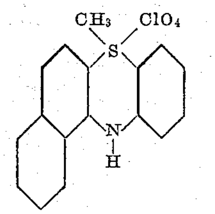

in ethylene glycol monomethyl ether, and after the light-sensitive layer has been dried it is exposed under a positive original for three minutes. The image produced in the layer is developed by treatment with 5% acetic acid containing 5% alum. A positive printing plate is obtained which gives a run of 5000 copies without difficulty. After storage of the unexposed light-sensitized plate for 32 days in a tropical chamber the prints produced from the plate are still good.

The S-methyl thiophenyl-alpha-naphthylamine sulphonium perchlorate is obtained as follows: 12.5 grams of thio-phenyl-alpha-naphthylamine and 7 grams of dimethyl sulphate are heated in a water bath for three quarters of an hour at a temperature not higher than 50° C. The melt is extracted with water, filtered, and the filtrate is then treated with animal charcoal. By adding perchloric acid to the solution the perchlorate is precipitated. In the beginning, it is often thickly viscous, but crystallizes quickly. It can be easily recrystallized from hot water.

Equally good results, but with even shorter exposure times, are obtained using S-methyl thiophenyl-beta-naphthylamine sulphonium perchlorate.

(3) A 1% solution of S-methyl-thiophenyl-beta-naphthylamine sulfonium perchlorate of the formula

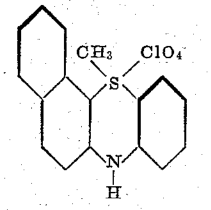

in glycol-monomethyl ether is coated on an aluminum plate, for instance by means of a plate-whirler.

After drying the coating, the light-sensitive foil is exposed to light for 2 minutes under a transparent positive pattern. By a subsequent treatment of the exposed foil with acetic acid containing alum and having the concentration described in Example 2, a positive printing plate is obtained which remains unaltered even after a great number of copies has been printed from it.

The beta-naphthylamine of this example is obtained in a manner similar to that described above for obtaining the alpha-naphthylamine. The thio-phenyl-beta-naphthylamine is obtained by heating 60 grams of phenyl-beta-naphthylamine, 17 grams sulphur, and 1/10 gram iodine in a vacuum (12–15 mm.) for two hours at a temperature of 200°. The melt is dissolved in boiling alcohol, precipitated with water, and the dried precipitate is crystallized from benzol and recrystallized from ligroin. There is obtained flat sulphur yellow needles having a melting point of 178° which exhibit strong green fluorescence in solution.

(4) An aluminum plate is coated with a 1% solution of S-ethyl-thiodiphenylamine-sulfonium-perclhorate of the formula

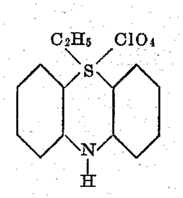

dissolved in glycol-monomethyl ether and dried. The dry light-sensitive aluminum plate is then exposed to light under a transparent positive pattern. After an exposure of 5 minutes the exposed layer is first inked with greasy ink and then treated with an aqueous solution containing 22.5 g. of secondary sodium phosphate and 27.5 g. of ammonium chloride per liter. After this treatment the aluminum plate shows a positive image of the pattern and may be used as a printing plate in a printing machine. Even after running a great number of copies, no damage to the plate is visible.

The S-ethyl-thiodiphenylamine-sulfonium-perchlorate is prepared in an analogous manner to the S-methyl-thiodiphenylamine-sulfonium perchlorate of Example 1.

(5) An aluminum plate was coated with a 1% glycol monomethyl ether solution of S-methyl-thio-di-α-naphthylamine sulfonium perchlorate of the formula

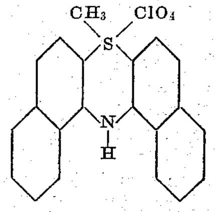

The coating is most advantageously performed by means of a plate whirler. The light sensitive layer is dried for a short time at a temperature of 100° C. and is then exposed to light for 3 minutes under a positive pattern. By treating the exposed plate with a solution containing 50 g. of acetic acid (100%) and 50 g. of alum per liter, the light decomposition product is washed away while the parts of the layer not hit by light remain on the plate and provide an ink receptive surface. Thus a positive printing plate is obtained which is very suitable for printing. A large run of copies can be obtained in an offset printing machine with such a plate. Even after a run of 5000 prints, the copies and the plate image remained unchanged.

The S-methyl-thio-di-α-naphthyl-amine sulfonium perchlorate is prepared as follows: 6 g. of thio-di-α-naphthylamine and 3 g. of di-methyl-sulfate are heated for 1 hour up to 80° C. The greenish-blue melt is digested with hot water, filtrated, and the filtrate is treated with animal charcoal and filtered again. From the filtrate the perchlorate is precipitated in the form of a white crystalline powder which is almost insoluble in cold water and somewhat better soluble in boiling water.

The thio-di-α-naphthylamine is obtained by heating 16 g. of di-α-naphthylamine, 4 g. of sulfur and 1/10 g. iodine for two hours. The temperature is 155° C. at the beginning and reaches 170–180° C. towards the end of the $H_2S$ development. The orange-colored melt is dissolved in as much chloroform as is necessary to yield a concentrated solution, from which solution, upon the addition of a sufficient quantity of a hot saturated solution of picric acid in chloroform, an abundant quantity of the black crystalline picrate of the thio compound precipitates. The reaction mixture is left standing for 12 hours and then drawn off. After removing the mother lye by washing with a saturated solution of picric acid in chloroform, the addition product is dried, powdered, and then treated with an excess of cold, dilute aqueous ammonia. The addition product is readily split into ammonium picrate, which partially dissolves and partially crystallizes, and thio-di-α-naphthyl-amine is produced in the form of an orange-colored powder, which remains undissolved, quickly turning superficially brown under the influence of light. The reaction mixture is drawn off and washed with boiled, lukewarm water until the water remains clear. The remaining undissolved mass consists of substantially pure thio compound.

What I claim is:

1. A presensitized printing plate comprising an aluminum base having a coating thereon comprising a compound having the formula:

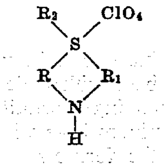

in which R and $R_1$ are arylene radicals and $R_2$ is an alkyl radical.

2. A presensitized printing plate comprising an aluminum base having a coating thereon comprising a compound having the formula

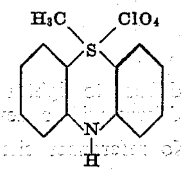

3. A presensitized printing plate comprising an aluminum base having a coating thereon comprising a compound having the formula

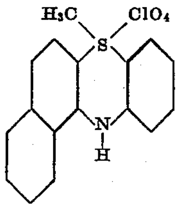

4. A presensitized printing plate comprising an aluminum base having a coating thereon comprising a compound having the formula

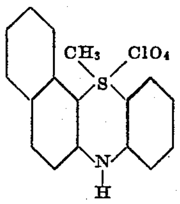

5. A presensitized printing plate comprising an aluminum base having a coating thereon comprising a compound having the formula

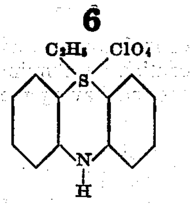

6. A presensitized printing plate comprising an aluminum base having a coating thereon comprising a compound having the formula

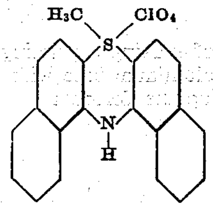

7. A method of making a presensitized printing plate which comprises coating an aluminum base with a layer comprising a compound having the formula

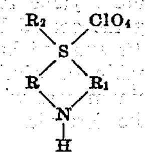

in which R and $R_1$ are arylene radicals and $R_2$ is an alkyl radical.

8. A method of making a presensitized printing plate which comprises coating an aluminum base with a layer comprising a compound having the formula

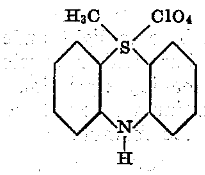

9. A method of making a presensitized printing plate which comprises coating an aluminum base with a layer comprising a compound having the formula

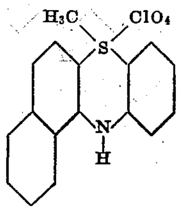

10. A method of making a presensitized printing plate which comprises coating an aluminum base with a layer comprising a compound having the formula

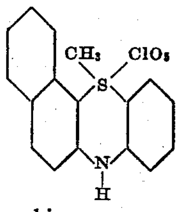

11. A method of making a presensitized printing plate which comprises coating an aluminum base with a layer comprising a compound having the formula

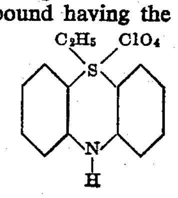

12. A method of making a presensitized printing plate which comprises coating an aluminum base with a layer comprising a compound having the formula

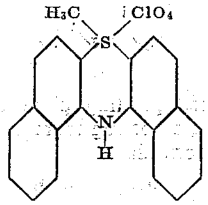

13. A method of making a printing plate which comprises coating an aluminum base with a layer comprising a compound having the formula

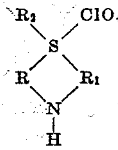

in which R and $R_1$ are arylene radicals and $R_2$ is an alkyl radical, exposing the coated base to light under a master, and treating the exposed base with a developer.

14. A method of making a printing plate which comprises coating an aluminum base with a layer comprising a compound having the formula

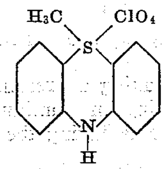

exposing the coated base to light under a master, and treating the exposed base with a developer.

15. A method of making a printing plate which comprises coating an aluminum base with a layer comprising a compound having the formula

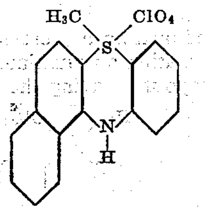

exposing the coated base to light under a master, and treating the exposed base with a developer.

16. A method of making a printing plate which comprises coating an aluminum base with a layer comprising a compound having the formula

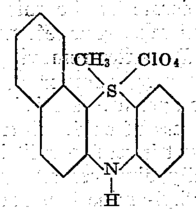

exposing the coated base to light under a master, and treating the exposed base with a developer.

17. A method of making a printing plate which comprises coating an aluminum base with a layer comprising a compound having the formula

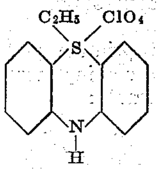

exposing the coated base to light under a master, and treating the exposed base with a developer.

18. A method of making a printing plate which comprises coating an aluminum base with a layer comprising a compound having the formula

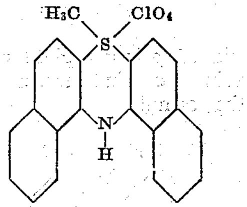

exposing the coated base to light under a master, and treating the exposed base with a developer.

No references cited.